United States Patent
Heid

(10) Patent No.: US 6,591,149 B1
(45) Date of Patent: Jul. 8, 2003

(54) METHOD FOR PRESCRIBING A RAMP BY A CLOCK-PULSE-CONTROLLED QUANTITY

(75) Inventor: Oliver Heid, Gunzenhausen (DE)

(73) Assignee: Siemens Aktiengesellschaft, München (DE)

( * ) Notice: Subject to any disclaimer, the term of this patent is extended or adjusted under 35 U.S.C. 154(b) by 328 days.

(21) Appl. No.: 09/666,372

(22) Filed: Sep. 20, 2000

(30) Foreign Application Priority Data

Sep. 21, 1999 (DE) .......................................... 199 45 179

(51) Int. Cl.$^7$ .............................................. G05B 21/22
(52) U.S. Cl. .............................. 700/74; 700/38; 700/39; 700/71; 700/72; 700/73; 341/13; 341/14; 341/118; 341/123; 327/126; 327/133; 327/134; 324/312; 324/313; 324/314
(58) Field of Search .............................. 700/71, 72, 73, 700/74, 38, 39; 341/13.14, 118, 119, 123; 73/159, 162, 432.1, 866.1; 327/133, 134, 126; 324/309, 318, 307, 311–314, 322

(56) References Cited

U.S. PATENT DOCUMENTS

| | | | |
|---|---|---|---|
| 3,676,784 A | | 7/1972 | Le Comte |
| 4,499,760 A | | 2/1985 | Fischer et al. |
| 4,631,520 A | | 12/1986 | Wingate |
| 5,512,828 A | * | 4/1996 | Pausch et al. ............... 324/309 |
| 5,514,160 A | * | 5/1996 | Kroll et al. ...................... 607/5 |
| 5,663,728 A | * | 9/1997 | Essenwanger .............. 341/153 |
| 5,689,176 A | * | 11/1997 | Deloy ........................ 323/222 |
| 5,825,154 A | * | 10/1998 | Runggaldier et al. ....... 318/757 |
| 6,169,433 B1 | * | 1/2001 | Farrenkopf .................. 327/131 |
| 6,208,140 B1 | * | 3/2001 | Gebhardt et al. ........... 324/309 |
| 6,236,204 B1 | * | 5/2001 | Heid ........................... 324/309 |
| 6,288,547 B1 | * | 9/2001 | Heid ........................... 324/322 |
| 6,310,478 B1 | * | 10/2001 | Heid ........................... 324/309 |
| 6,346,801 B1 | * | 2/2002 | Zafarana et al. ............. 323/284 |
| 6,369,569 B1 | * | 4/2002 | Heid ........................... 324/309 |
| 6,404,195 B1 | * | 6/2002 | Deimling .................... 324/308 |

FOREIGN PATENT DOCUMENTS

| | | |
|---|---|---|
| DE | 515 658 | 12/1971 |
| DE | 32 05 240 | 8/1987 |

OTHER PUBLICATIONS

Echo–Planar Imaging Pulse Sequences—Wielopolski et al—pp. 64–177.

* cited by examiner

Primary Examiner—Ramesh Patel
(74) Attorney, Agent, or Firm—Schiff Hardin & Waite

(57) ABSTRACT

In a method for prescribing an essentially linear ramp with a prescribable slope by a quantity, and which is clock-pulse-controlled and which describes the ramp by an increment per clock interval, the ramp is described by a number of regular increments and by at least one first and one second irregular increment. The regular increments exhibit a value corresponding to the prescribable slope. The irregular increments exhibit a value deviating from the prescribable slope. The first irregular increment is a first increment describing the ramp and the second irregular increment is a last increment describing the ramp.

5 Claims, 1 Drawing Sheet

METHOD FOR PRESCRIBING A RAMP BY A CLOCK-PULSE-CONTROLLED QUANTITY

BACKGROUND OF THE INVENTION

The invention relates to a method for prescribing an essentially linear ramp having a prescribable slope by a quantity, which is clock-pulse-controlled and which describes the ramp by an increment per clock interval. In magnetic resonance tomography, a frequency and phase coding that is dependent on the location is effected by gradient fields. For this purpose, the gradient system contains a gradient control system, gradient amplifiers and gradient coils. The gradient coil is connected to the gradient amplifier for feeding current. The gradient amplifier is controlled by a quantity that is prescribed by the gradient control system, so that the gradient coil is traversed by a corresponding current for generating the gradient field. The quantity must exactly follow a prescribed curve. The curve contains what are referred to as gradient pulses, which are defined by a start amplitude and an end amplitude, for example, whereupon the gradient control system outputs corresponding ramps. The rise and decay rates are limited by the performance capacity of the gradient amplifier and an inductivity of the gradient coil.

Given a series of magnetic resonance tomography devices of the applicant, the quantity is calculated by digital signal processors, which are correspondingly programmed therefor.

For example, a gradient system of a magnetic resonance tomography device makes it necessary to prescribe ramps for generating gradient fields. For picking up oblique or double-oblique magnetic resonance images, the signal processor, among other things, must carry out multiplications with rotation matrices for calculating the corresponding quantity. For this purpose, increments are formed for the quantity in order to save calculating time, and these increments are subjected to the aforementioned multiplication. Finally, the quantity is formed in that a multiplied increment is added in a specific clock to the respective transient value of the output quantity.

As it has already been mentioned above, gradient fields effect the frequency and phase coding, which is dependent on the location and which is described with what is referred to as k-space representation, in the magnetic resonance tomography. The following definition is valid for the k-space:

$$k_x(t) = \gamma \int_0^t G_x(t') dt'$$

$$k_y(t) = \gamma \int_0^t G_y(t') dt'$$

$$k_z(t) = \gamma \int_0^t G_z(t') dt'$$

$\gamma$ is the Larmor constant and $G_x$, $G_y$, $G_z$ a magnetic field in the direction x, y, or, respectively, z of a Cartesian system of coordinates.

Given what are referred to as pulse sequences, only one k-space row is acquired per sequence run for generating two-dimensional tomograms, for example, so that sequence runs corresponding to the number of k-space rows are altogether necessary in order to completely build up a raw data matrix of the k-space. In contrast thereto, all k-space rows are acquired with one single sequence run given the echo planar techniques.

The different published versions of the echo planar technique ultimately only differ as to how the phase coding gradients are switched, i.e., in which order the data points of the raw data matrix are sampled. In a first version, a constant phase coding gradient is switched during the entire readout phase. Thereby, the k-space is traversed in a zigzag line alternately from the left to the right and vice-versa. This means that the k-space is not traversed on linear sections parallel or, respectively, antiparallel to the Cartesian coordinate axes of the k-space and not on the regular Cartesian raster points of the k-space. This is achieved in a second version by phase coding gradients that are switched by pulses.

In order to be able to utilize simple Fourier algorithms for calculating magnetic resonance images from the raw data matrix, it is desirable that the raster points in the k-space are arranged in a regular Cartesian raster. Errors regarding the determination of the sampling points depending on the gradient time integral lead to an inaccurate placement of the raw data in the k-space. Each inaccurate k-space placement leads to artifacts in the magnetic resonance image.

Since the entire data acquisition must be completed, in the echo planar technique, within one time span, which approximately corresponds to the decay time of the transverse magnetization of circa 100 ms, the accuracy requirements with respect to the gradient and sampling system are extremely high for avoiding artifacts. For example, this means that a time resolution of approximately 20 to 50 ns, which corresponds to a clock frequency of 20 to 50 MHz, is required for the size of the gradient control system for prescribing gradient pulses.

When the quantity is prescribed by aforementioned clock frequencies, a corresponding cost-intensive gradient control system results, which only has a limited effect concerning a high time resolution as long as current gradient amplifiers only have a limited bandwidth of approximately 20 kHz due to currently available components. In current gradient control systems, the quantity is prescribed with a clock frequency of approximately 100 kHz. In the echo planar technique, the artifact suppression therefore is carried out, in an involved way, by specific image reconstruction algorithms and/or an exact temporal positioning of gradient pulses by calibration by means of what are referred to as navigator echos with respect to current devices. In this context in relation to the echo planar technique, we are referring to the book of F. Schmitt et al., "Echo-Planar Imaging", Springer, Berlin, Heidelberg, 1998, particularly to the chapters 4 and 5.

U.S. Pat. No. 4,631,520 describes a compensation device for a distance sensor for compensating errors of a scale grid of the distance sensor, in particular. For a linear scale grid, FIG. 1 thereby shows a succession of measuring points, which are entered over a length of the scale grid and shows a best straight line regarding the measuring points. It is not disclosed to prescribe the best straight line, which represents a linear ramp, by means of a clock-pulse-controlled quantity by an increment per clock interval.

DE 32 05 240 C2 describes a method for measuring a mutual position of two arbitrarily frequent impulse sequences. For example, the rotational angles of two rotation bodies are transformed into corresponding impulse sequences by incremental rotary encoders. FIG. 2 of DE 32 05 240 C2 shows one of the rotational angles that is acquired by one of the incremental rotary encoders over time. The ramp of FIG. 2, which is essentially linear, is determined by points that are respectively placed when a quantization step of the rotational angle is reached. As a result thereof, time intervals between adjacent points are different. Therefore, the essentially linear ramp is not prescribed by a clock-pulse-controlled quantity, which is characterized by prescribing points on a time-equidistant raster.

CH 515 658 describes a sawtooth or ramp generator, wherein a sawtooth function can be prescribed as a digital quantity, which is clock-pulse-controlled, and wherein a corresponding analog sawtooth function can be output after a digital-analog-conversion via a control loop. In the case of a loop amplification of the control loop unequal to one, essentially linear ramps of the analog sawtooth function, in an undesired way, exhibit an increment during at least one first clock interval of one of the ramps without countermeasures, this increment exhibiting a value deviating from the desired slope of the ramp. Corresponding countermeasures can suppress the aforementioned undesired effect.

SUMMARY OF THE INVENTION

It is an object of the invention to create a method for prescribing an essentially linear ramp with a prescribable slope by a quantity that is clock-pulse-controlled and that describes the ramp per clock interval by an increment, which method reduces the aforementioned disadvantages and which particularly allows an exact temporal positioning of ramps.

This object is achieved according to the invention wherein the ramp is described by a number of regular increments and by at least one first and second irregular increment, wherein: the regular increments exhibit a value corresponding to the prescribable slope; the irregular increments exhibit a value deviating from the prescribable slope; the first irregular increment is a first increment describing the ramp: and the second irregular increment is a last increment describing the ramp. Particularly ramps, which start or end at points in time, which are situated between the time raster fixed by a clock frequency, can thereby be positioned in terms of time with a high resolution. An increase in clock frequency is not necessary therefor. An increment is not exclusively a value around which the quantity increases but also a value around which the quantity decreases given a preceding sign of the slope.

In an advantageous embodiment, the quantity is a set value for a current of a gradient coil of a magnetic resonance tomography device. Thus, a positioning of ramps of a gradient pulse that is highly resolved in terms of time can be obtained given an economic clock frequency of a gradient control system. For example, this makes it possible to exactly adhere prescribable zero time-moments of a gradient field, which is important for an exact k-space placement and therefore for a high quality of magnetic resonance images.

Further advantages, features and details of the invention derive from the following description of an exemplary embodiment of the invention on the basis of the drawings. Shown are:

DESCRIPTION OF THE PREFERRED EMBODIMENTS

Figure 1:
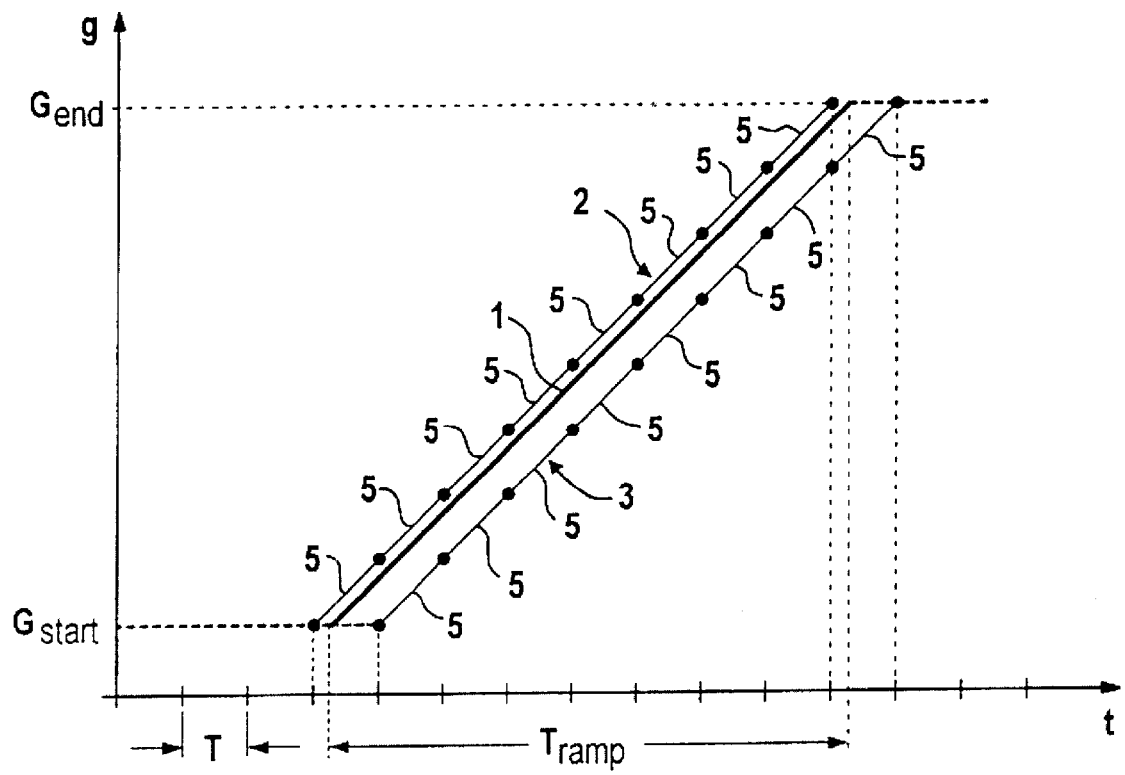
FIG. 1 shows schematically a linear ramp that is positioned as desired and its default by a clock-pulse-controlled quantity according to the prior art.

FIG. 1 shows the two best possible defaults by a clock-pulse-controlled quantity according to the prior art for a linear ramp 1 that is time-positioned as desired. The ramp 1 is characterized by a start value $G_{start}$, an end value $G_{end}$ and by a time duration $T_{ramp}$, whereby a slope of the ramp 1 is also determined by the mathematical term $(G_{end}-G_{start})/T_{ramp}$. The clock-pulsed-controlled quantity g prescribes the ramp 1 by a number of regular increments 5, whose values equal the slope of the ramp 1. For this purpose, a regular increment 5 is added to the respective momentary value of the clock-pulse-controlled quantity g per clock interval T. As a result of the clocking and the same regular increments 5, the ramp 1 time-positioned as desired is approximated by an early linear ramp 2 or by a late linear ramp 3, whereby the ramps 2 and 3 are formed by the regular increments 5 of the clock-pulse-controlled quantity g. A better approximation can only be achieved here by increasing the temporal resolution as a result of a shortening of the clock interval T, i.e., an increase of the clock frequency. Merely a desired ramp, which starts with a start or an end of a clock interval T and which ends with a start or an end of a clock interval T, can be exactly prescribed regarding its temporal position with the aforementioned method according to the prior art by the clock-pulse-controlled quantity g.

Figure 2:
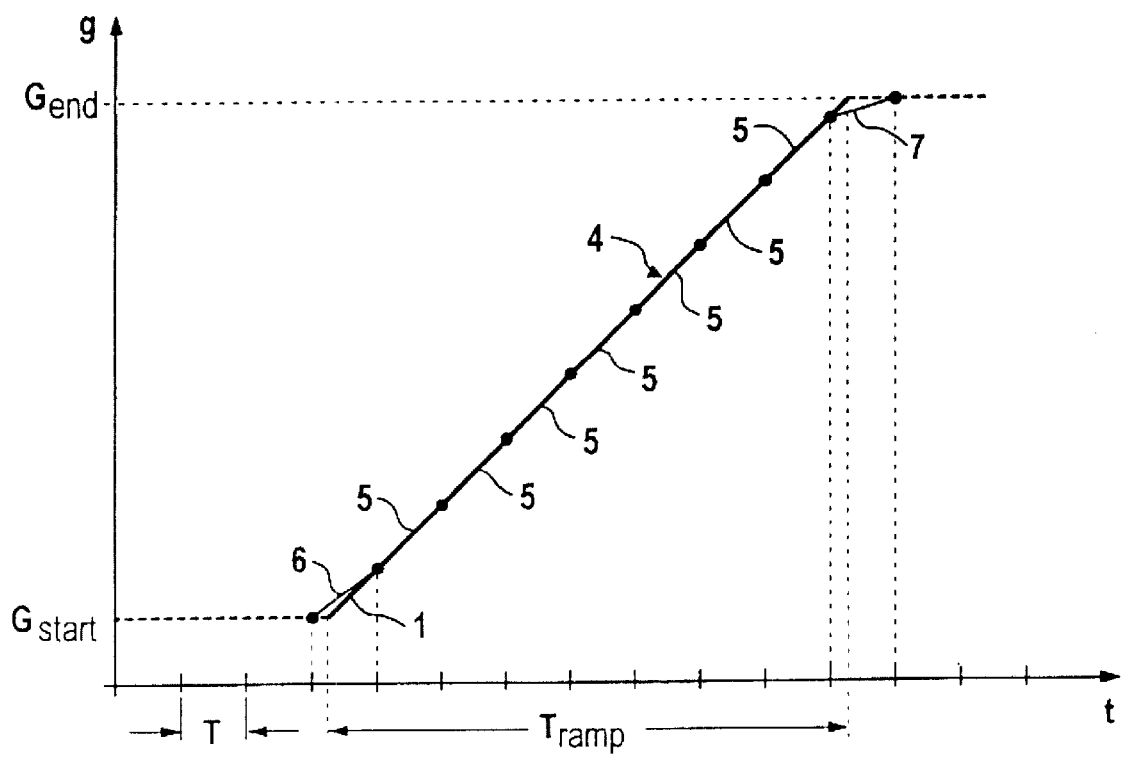
FIG. 2 shows schematically a linear ramp that is positioned as desired and its default by a clock-pulse-controlled quantity as an exemplary embodiment of the invention.

FIG. 2 shows, for an exemplary embodiment of the invention, a default of a linear ramp that is time-positioned as desired by a clock-pulse-controlled quantity. FIG. 2 shows the same desired ramp as FIG. 1. Likewise in FIG. 1, increments are added to the respective momentary value of the clock-pulse-controlled quantity g for prescribing the ramp 1 by the clock-pulse-controlled quantity g. In contrast to FIG. 1, a first irregular increment 6 and a last irregular increment 7 exhibit a same value that is smaller in terms of amount than the other regular increments 5, whose value is determined by the slope of the ramp 1. Thus, the regular increments 5 and the irregular increments 6 and 7 of the clock-pulse-controlled quantity g form a ramp 4, which does justice to the desired temporal positioning of the ramp 1.

Although the invention has been described with respect to preferred embodiments, it is not to be so limited as changes and modifications can be made therein which are within the full intended scope of the invention as defined by the appended claims.

I claim as my invention:

1. A method for prescribing a set value for a current of a gradient coil of a magnetic resonance tomography device, comprising the steps of:

prescribing an essentially linear ramp with a prescribable slope which is described by a quantity which is said set value for said gradient coil current;

providing said quantity as clock-pulse-controlled and which describes the ramp by an increment per clock interval;

describing the ramp by a number of regular increments and by at least one first and one second irregular increment;

the regular increments exhibiting a value corresponding to the slope;

the irregular increments exhibit a value deviating from the prescribable slope;

the first irregular increment being a first increment describing the ramp; and the second irregular increment being a last increment describing the ramp.

2. The method according to claim 1 wherein the irregular increments exhibit a value that is smaller in terms of a mount than the regular increments.

3. The method according to claim 1 wherein the irregular increments exhibit a same value.

4. The method according to claim 1 wherein the quantity is a discrete quantity.

5. A method for prescribing a set value for a parameter of a gradient coil of a magnetic resonance tomography device, comprising the steps of:

prescribing an approximate linear ramp with a prescribable slope which is described by a quantity which is said set value for said gradient coil current;

providing said quantity which describes the ramp by an increment per clock interval;

describing the ramp by a number of regular increments and by at least one first and second irregular increments;

the regular increments exhibiting a value corresponding to the slope;

the irregular increments exhibiting a value deviating from the prescribable slope;

the first irregular increment being a first increment describing the ramp;

the second irregular increment being a last increment describing the ramp;

the quantity being a discrete quantity; and the irregular increments exhibit a value that is smaller in terms of amount then the regular increments.

* * * * *